United States Patent
Hagiwara et al.

(10) Patent No.: US 11,101,555 B2
(45) Date of Patent: Aug. 24, 2021

(54) STRUCTURE, ANTENNA STRUCTURE, RADIO WAVE SHIELDING STRUCTURE, AND TOUCH PANEL INCLUDING MESH-LIKE TRANSPARENT CONDUCTOR

(71) Applicant: NIHON DENGYO KOSAKU CO., LTD., Tokyo (JP)

(72) Inventors: Hiroki Hagiwara, Tokyo (JP); Akira Maruyama, Tokyo (JP)

(73) Assignee: NIHON DENGYO KOSAKU CO., LTD., Tokyo (JP)

( * ) Notice: Subject to any disclaimer, the term of this patent is extended or adjusted under 35 U.S.C. 154(b) by 0 days.

(21) Appl. No.: 16/615,821

(22) PCT Filed: Feb. 23, 2018

(86) PCT No.: PCT/JP2018/006688
§ 371 (c)(1),
(2) Date: Nov. 22, 2019

(87) PCT Pub. No.: WO2019/163087
PCT Pub. Date: Aug. 29, 2019

(65) Prior Publication Data
US 2020/0083600 A1    Mar. 12, 2020

(51) Int. Cl.
*H01Q 1/00* (2006.01)
*H01Q 1/36* (2006.01)
*H01Q 1/52* (2006.01)

(52) U.S. Cl.
CPC .............. *H01Q 1/36* (2013.01); *H01Q 1/526* (2013.01)

(58) Field of Classification Search
CPC ............ H01Q 1/36; H01Q 1/48; H01Q 1/526; H01Q 21/30; H05K 9/00
See application file for complete search history.

(56) References Cited

U.S. PATENT DOCUMENTS

| | | | |
|---|---|---|---|
| 2011/0237309 A1 | 9/2011 | Shoji | |
| 2011/0241969 A1 | 10/2011 | Zhang | |
| 2015/0061942 A1* | 3/2015 | Koyama | ............... H05K 1/0274 343/700 MS |

(Continued)

FOREIGN PATENT DOCUMENTS

| | | |
|---|---|---|
| CN | 102292873 | 12/2011 |
| CN | 104396358 | 3/2015 |

(Continued)

OTHER PUBLICATIONS

Julien Hautcoeur et al., "Feasibility Study of Optically Transparent CPW-Fed Monopole Antenna at 60-GHz ISM Bands", IEEE Transactions on Antennas and Propagation, Apr. 2013, pp. 1-8.

(Continued)

Primary Examiner — Thien M Le
(74) Attorney, Agent, or Firm — JCIPRNET

(57) ABSTRACT

The antenna structure as an example of a structure including a mesh-like transparent conductor includes: a film made of an electrical insulating material transmitting visible light; a surface section provided on one face of the film, made of a mesh-like conductive material, and having a predetermined shape; and a bordering section provided on the one face of the film and configured to border at least a part of edges of the surface section α with a conductive material.

9 Claims, 7 Drawing Sheets

(56) References Cited

U.S. PATENT DOCUMENTS

| | | | |
|---|---|---|---|
| 2015/0255856 A1 | 9/2015 | Hong | |
| 2015/0309229 A1* | 10/2015 | Ren | G02B 5/282 |
| | | | 359/360 |
| 2016/0049731 A1 | 2/2016 | Yamamoto et al. | |
| 2017/0093021 A1* | 3/2017 | Kim | H01Q 7/00 |
| 2017/0373397 A1 | 12/2017 | Yashiro | |
| 2018/0246318 A1* | 8/2018 | Shian | G02B 26/08 |
| 2019/0058242 A1* | 2/2019 | Tabe | H01Q 1/248 |
| 2019/0179445 A1* | 6/2019 | Moon | G06F 3/044 |
| 2020/0233508 A1* | 7/2020 | Chan | G06F 3/0445 |
| 2020/0413578 A1* | 12/2020 | Toyoda | B32B 27/302 |

FOREIGN PATENT DOCUMENTS

| | | |
|---|---|---|
| CN | 104699291 | 6/2015 |
| CN | 106104915 | 11/2016 |
| CN | 107004956 | 8/2017 |
| EP | 0911906 | 4/1999 |
| JP | H024306 | 1/1990 |
| JP | 2006303846 | 11/2006 |
| JP | 2011205635 | 10/2011 |
| JP | 2015089109 | 5/2015 |
| JP | 2015115642 | 6/2015 |
| JP | 2015191647 | 11/2015 |
| JP | 2017097439 | 6/2017 |
| WO | 2013157420 | 10/2013 |
| WO | 2014163207 | 10/2014 |

OTHER PUBLICATIONS

"International Search Report (Form PCT/ISA/210) of PCT/JP2018/006688," dated May 1, 2018, with English translation thereof, pp. 1-4.

* cited by examiner

STRUCTURE, ANTENNA STRUCTURE, RADIO WAVE SHIELDING STRUCTURE, AND TOUCH PANEL INCLUDING MESH-LIKE TRANSPARENT CONDUCTOR

CROSS-REFERENCE TO RELATED APPLICATION

This application is a 371 application of the International PCT application serial no. PCT/JP2018/006688, filed on Feb. 23, 2018. The entirety of each of the above-mentioned patent application is hereby incorporated by reference herein and made a part of this specification.

TECHNICAL FIELD

The present invention relates to a structure, an antenna structure, a radio wave shielding structure, and a touch panel each including a mesh-like transparent conductor.

BACKGROUND ART

Patent Document 1 discloses a conductive film including a first mesh pattern and a second mesh pattern. Assuming that the first mesh pattern can be regarded as a Voronoi diagram, a generator of a polygon is positioned at the center point C of that polygon, and in a subject polygon included in multiple polygons constituting the first mesh pattern, an average length of perpendiculars drawn from the center point C of the subject polygon to the respective sides of the subject polygon is defined as a reference distance of the subject polygon. When viewed from a direction facing the first surface of a transparent dielectric layer, a vertex of a polygon constituting the second mesh pattern is located within a circle R that is centered about the center point C of the subject polygon and whose radius is ⅕ the reference distance.

Patent Document 2 discloses a touch panel sensor member including a transparent substrate and sensor electrodes placed at least on one face of the transparent substrate. Branch points of the mesh-like conductor forming the sensor electrodes are irregularly deviated from respective corresponding intersections in a reference mesh pattern where multiple rhombus-shaped reference mesh openings are regularly arranged. Also, a contour connecting outer peripheral ends of the electrode elements of the mesh-like conductor runs in parallel along linear portions of the respective outermost conductor elements forming the electrode elements.

CITATION LIST

Patent Literature

Patent Document 1: Japanese Patent Application Laid-Open Publication No. 2017-097439
Patent Document 2: Japanese Patent Application Laid-Open Publication No. 2015-191647

SUMMARY OF INVENTION

Technical Problem

A transparent conductor made of a mesh-like conductive material (a mesh-like transparent conductor) may be used to ensure transparency to visible light. If such a transparent conductor has protrusions along its edge, micro discharge is likely to occur at the tips of the protrusions, which may generate intermodulation (IM) wave. Accordingly, when signals of multiple frequencies are used, passive intermodulation (PIM) characteristics may deteriorate.

An object of the present invention is to provide a structure and the like including the mesh-like transparent conductor that can reduce deterioration in passive intermodulation (PIM) characteristics.

Solution to Problem

According to a first aspect of the present invention, there is provided a structure including a mesh-like transparent conductor, the structure including: a substrate composed of an electrical insulating material transmitting visible light; a surface section provided on one face of the substrate, the surface section being made of a mesh-like conductive material and having a predetermined shape; and a bordering section provided on the one face of the substrate, the bordering section being configured to border at least a part of edges of the surface section with a conductive material.

According to a second aspect of the present invention, in the first aspect, the bordering section is provided near an area with a highest electric field.

According to a third aspect of the present invention, in the first aspect, the bordering section is provided so as to surround the edges of the surface section.

According to a fourth aspect of the present invention, there is provided an antenna structure including: a substrate made of an electrical insulating material transmitting visible light; and an antenna element provided on one face of the substrate, the antenna element being configured to transmit and receive radio waves, wherein the antenna element includes: a surface section made of a mesh-like conductive material and having a predetermined shape; and a bordering section configured to border at least a part of edges of the surface section with a conductive material.

According to a fifth aspect of the present invention, in the fourth aspect, the antenna element includes a radiation electrode and a ground electrode, and the bordering section is provided at portions of the radiation electrode and the ground electrode where the radiation electrode and the ground electrode are near each other.

According to a sixth aspect of the present invention, there is provided a radio wave shielding structure including: an electrical insulating substrate transmitting visible light; and a radio wave shielding part provided on one face of the substrate and configured to prevent transmission of at least radio waves of a predetermined frequency band, wherein the radio wave shielding part includes: a surface section made of a mesh-like conductive material; and a bordering section configured to border at least a part of edges of the surface section with a conductive material.

According to a seventh aspect of the present invention, in the sixth aspect, the bordering section is provided at a portion of the radio wave shielding part that is near an external antenna structure configured to transmit and receive radio waves of multiple frequencies.

According to an eighth aspect of the present invention, there is provided a touch panel including: a first electrical insulating substrate transmitting visible light; a first electrode provided on one face of the first substrate and extending in a predetermined direction; a second electrical insulating substrate transmitting visible light; and a second electrode provided on one face of the second substrate and extending in a direction crossing the predetermined direction, wherein the first electrode and the second electrode are arranged to face each other between the first substrate and the second substrate, wherein each of the first electrode and the second electrode includes: a surface section made of a mesh-like conductive material; and a bordering section configured to border at least a part of edges of the surface section with a conductive material.

According to a ninth aspect of the present invention, in the eighth aspect, the bordering section is provided at portions of the first electrode and the second electrode that are near an external antenna structure configured to transmit and receive radio waves of multiple frequencies.

Advantageous Effects of Invention

The first, fourth, sixth, and eights aspects of the present invention allow to reduce deterioration in passive intermodulation (PIM) characteristics.

The second aspect of the present invention allows to reduce occurrence of the IM wave, as compared to when the bordering section is not provided near an area with a highest electric field.

The third aspect of the present invention allows to more effectively reduce occurrence of the IM wave, as compared to when the bordering section is not provided so as to surround the edges of the surface section.

The fifth aspect of the present invention allows to reduce occurrence of the IM wave, as compared to when the bordering section is not provided at portions where the radiation electrode and the ground electrode are near each other.

The seventh and ninth aspects of the present invention allow to reduce occurrence of the IM wave, as compared to when the bordering section is not provided at a portion near an antenna structure.

BRIEF DESCRIPTION OF DRAWINGS

FIG. 1A shows an antenna structure of the first embodiment, and FIG. 1B shows an antenna structure as a comparative example.

FIG. 4A shows a positional relationship where there is a short distance between a point of intersection on the lattice constituting the surface section and the bordering section. FIG. 4B shows a positional relationship where there is a large distance between a point of intersection on the lattice constituting the surface section and the bordering section.

FIG. 5A shows the surface section having a lattice-like mesh pattern. FIG. 5B shows the surface section having a random mesh pattern.

DESCRIPTION OF EMBODIMENTS

Antennas have been required to fit into the landscape. This is made by composing an antenna element transmitting and receiving radio waves, which is often exposed to the outside, of a conductor (transparent conductor) that transmits visible light (having high visible light transmittance), so that the antenna element is hardly recognizable and thus blends in the environment.

Also, touch panels placed on display devices, e.g., liquid crystal panels, for accepting input from fingers or other instruments have been required to use, as an electrode constituting a touch section, a conductor (transparent conductor) that is transparent to visible light and allows for easy recognition of the display device.

As a material for such a transparent conductor, use has been made of an indium tin oxide (ITO) film, which is an oxide semiconductor, and a thin silver (Ag) film, for example. However, the transparent conductor made of these materials has a large sheet resistance of about 20 Ω/sq. Accordingly, delay due to resistance increases with increase in the size of the antenna or the touch panel, and this makes the above materials unsuitable for use. In view of this, more recently, use has been made of a transparent conductor that is made of a cupper (Cu) film or a silver (Ag) film processed into a mesh form to achieve higher visible light transmittance. This transparent conductor has a thickness that hardly transmits visible light prior to being processed into a mesh form; in other words, the transparent conductor is opaque to visible light. Once being processed into a mesh form, the transparent conductor as a whole has high visible light transmittance; in other words, the transparent conductor becomes transparent to visible light. Herein, the quality of having high visible light transmittance is referred to as "transmitting visible light". This transparent conductor can easily achieve sheet resistance of 1 Ω/sq. or less. Hereinafter, the transparent conductor processed into a mesh form is referred to as a "mesh-like transparent conductor".

When the mesh-like transparent conductor is used as an antenna element or an electrode constituting a touch section of a touch panel, any protrusion on an edge of the conductor is likely to generate micro discharge at the protrusion. When signals of multiple frequencies are used, the micro discharge may generate an IM wave, which may deteriorate PIM characteristics.

Below a description will be given of a structure and the like including the mesh-like transparent conductor that is less prone to deterioration of PIM characteristics, with reference to attached drawings.

First Embodiment

In the first embodiment, a description will be given of an antenna structure as an example of a structure including the mesh-like transparent conductor.

Figure 1A:
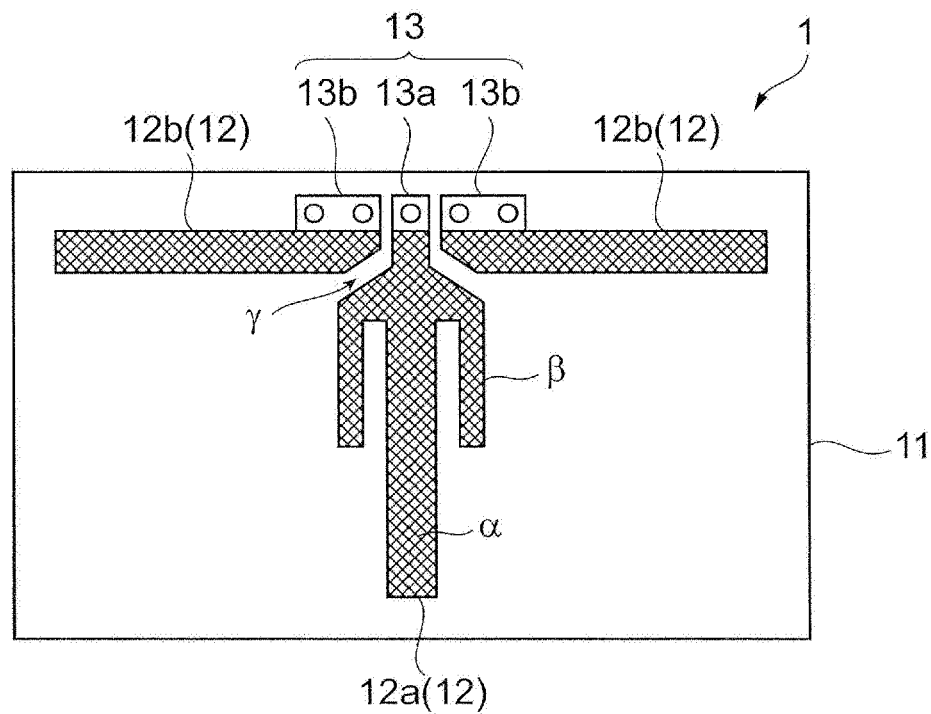
FIGS. 1A and 1B are plan views of antenna structures.
Figure 1B:
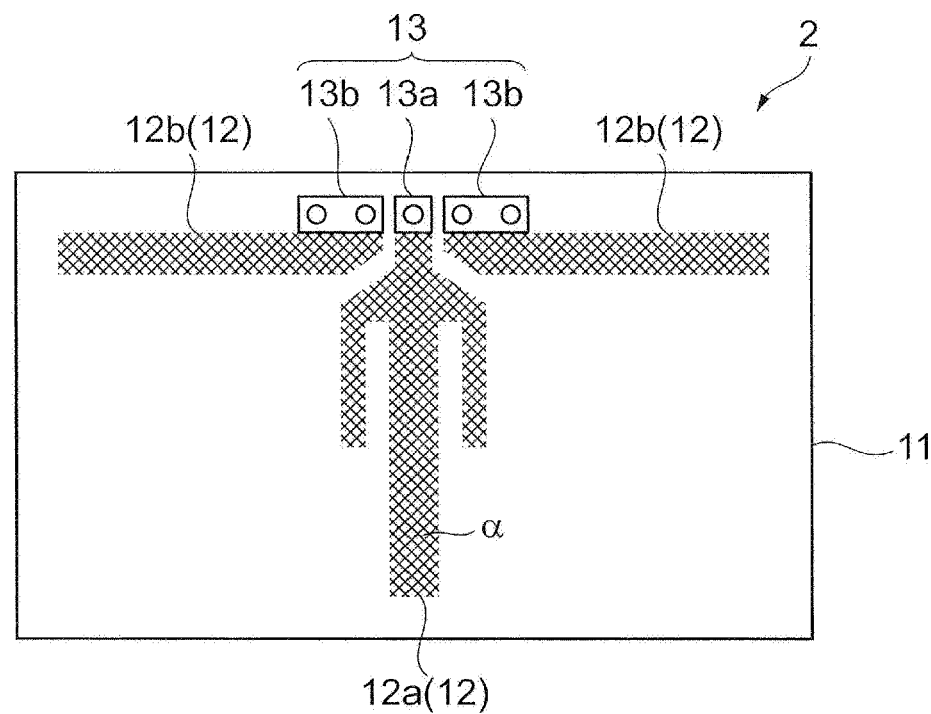

FIGS. 1A and 1B are plan views of antenna structures. FIG. 1A shows an antenna structure 1 of the first embodiment, and FIG. 1B shows an antenna structure 2 as a comparative example.

Each of the antenna structures 1 and 2 is configured as a flexible printed circuit (FPC) board.

Each of the antenna structures 1 and 2 includes a film 11 made of an electrical insulating material having high visible light transmittance, an antenna element 12 placed on the film 11 (a surface of the film 11), and a contact part 13 placed on the film 11 to provide electrical contact with the antenna element 12.

The antenna element 12 includes a dual-frequency antenna 12a operating at two frequencies of e.g., 800 MHz band and 2.1 GHz band, and antenna GNDs 12b connected to the ground (GND). The dual-frequency antenna 12a includes one root and three branching distal ends and extends in one direction. The antenna GNDs 12b are provided on respective sides of the dual-frequency antenna 12a on the film 11. The two antenna GNDs 12b extend in a direction crossing (in this example, perpendicular to) the one direction in which the distal ends of the dual-frequency antenna 12a extend.

The contact part 13 includes a contact 13a connected to the root of the dual-frequency antenna 12a and two contacts 13b respectively connected to the two antenna GNDs 12b.

In the antenna structure 1, the dual-frequency antenna 12a and the antenna GNDs 12b of the antenna element 12 are made of a transparent conductor processed into a mesh form (mesh-like transparent conductor). By way of example, the planar shape of the mesh pattern of the transparent conductor is lattice-shaped. In the antenna structure 1, each of the dual-frequency antenna 12a and the antenna GNDs 12b includes a lattice-shaped surface section α made of a conductive material and a bordering section β made of a conductive material and laid along the edges of the surface section α.

The film 11 is an example of the substrate, the dual-frequency antenna 12a is an example of the radiation electrode, and the antenna GNDs 12b are an example of the ground electrode.

That is, the surface section α has a shape formed by cutting an entirely lattice-shaped transparent conductor (mesh-like transparent conductor) into the dual-frequency antenna 12a and the antenna GNDs 12b. Cutting the mesh-like transparent conductor into the shape of the surface section α involves cutting the mesh (lattice). Cutting the lattice results in its edges being exposed, producing branch-like protrusions of the conductor forming the lattice.

The bordering section β extends so as to border the edges of the dual-frequency antenna 12a and the antenna GNDs 12b. The bordering section β thereby connects the tips of the branch-like protrusions along the edges of the surface section α cut into the shape of the dual-frequency antenna 12a and the antenna GNDs 12b. That is, the bordering section β is provided so as to prevent the branch-like protrusions from being left exposed.

In the antenna structure 2, which is given as a comparative example, the dual-frequency antenna 12a and the antenna GNDs 12b of the antenna element 12 are also made of a mesh-like transparent conductor. However, the dual-frequency antenna 12a and the antenna GNDs 12b of the antenna structure 2 do not include the bordering section β to border their edges, though they have the surface section α. As a result, tips of the lattice constituting the surface section α, namely the branch-like protrusions, are present along the edges.

The film 11 may be a film made of an electrical insulating material and having high visible light transmittance. For example, the film 11 may be made of a transparent resin material having high light transmittance, such as polyethylene terephthalate (PET) resin. Alternatively, the film 11 may be made of a glass material. The film 11 is not necessarily plastic (flexible), and may be plate-shaped.

The conductive material constituting the mesh-like transparent conductor for the antenna element 12 may be a material having high electric conductivity and easy to process into the mesh form. For example, the conductive material may be copper (Cu), silver (Ag), or aluminum (Al).

The antenna structure 1 of the first embodiment is manufactured by etching a conductive material, such as a copper (Cu) film or a silver (Ag) film, formed on the film 11. Specifically, an etching mask with a pattern that has a shape corresponding to the dual-frequency antenna 12a and the antenna GNDs 12b and includes the surface section α having a mesh-like surface and the bordering section β along the edges of the surface section α is formed on the conductive material. The etching mask is formed such that a portion of the conductive material corresponding to the contact part 13 remains unprocessed into the mesh form. Using this etching mask, the conductive material, such as a copper (Cu) film or a silver (Ag) film, formed on the film 11 is etched. This integrally forms, by a single etching, the surface section α formed into the lattice, the bordering section β bordering the surface section α, and the contact part 13. In other words, the single etching forms the lattice-shaped surface section α of each of the dual-frequency antenna 12a and the antenna GNDs 12b, the bordering section β bordering the surface section α, the contact 13a connected to the dual-frequency antenna 12a, and the contacts 13b respectively connected to the antenna GNDs 12b.

The antenna structure 2, which is given as a comparative example, is manufactured by processing a conductive material (transparent conductor) pre-shaped as a lattice into the shape of the dual-frequency antenna 12a and the antenna GNDs 12b (the shape of the surface section α). In this case, the bordering section β is not formed. The antenna structure 2 also requires forming the contact part 13 separately.

Alternatively, the antenna structure 1 may be manufactured by bordering the edges of the dual-frequency antenna 12a and the antenna GNDs 12b of the antenna structure 2 with a conductive material such as conductive paste. For example, the bordering section β may be formed with a brush or pen with conductive paste. Alternatively, a dispenser may be filled with conductive paste as ink and the dispenser may eject the conductive paste to form the bordering section β. When the dispenser is used, the antenna structure 2 may be placed on an XY stage and the conductive paste may be applied along the edges of the dual-frequency antenna 12a and the antenna GNDs 12b to thereby form the bordering section β. This can automate the formation of the bordering section β. Note that this method may cause misalignment of the bordering section β formed with the conductive paste relative to the edges of the dual-frequency antenna 12a and the antenna GNDs 12b. This method also requires forming the contact part 13 separately. Hence, it is preferable to use the method whereby the surface section α, the bordering section β, and the contact part 13 are integrally formed.

With the contact part 13 being connected to a signal transmitting and receiving device (not shown), the antenna structure 1 transmits or receives radio waves.

Figure 2:
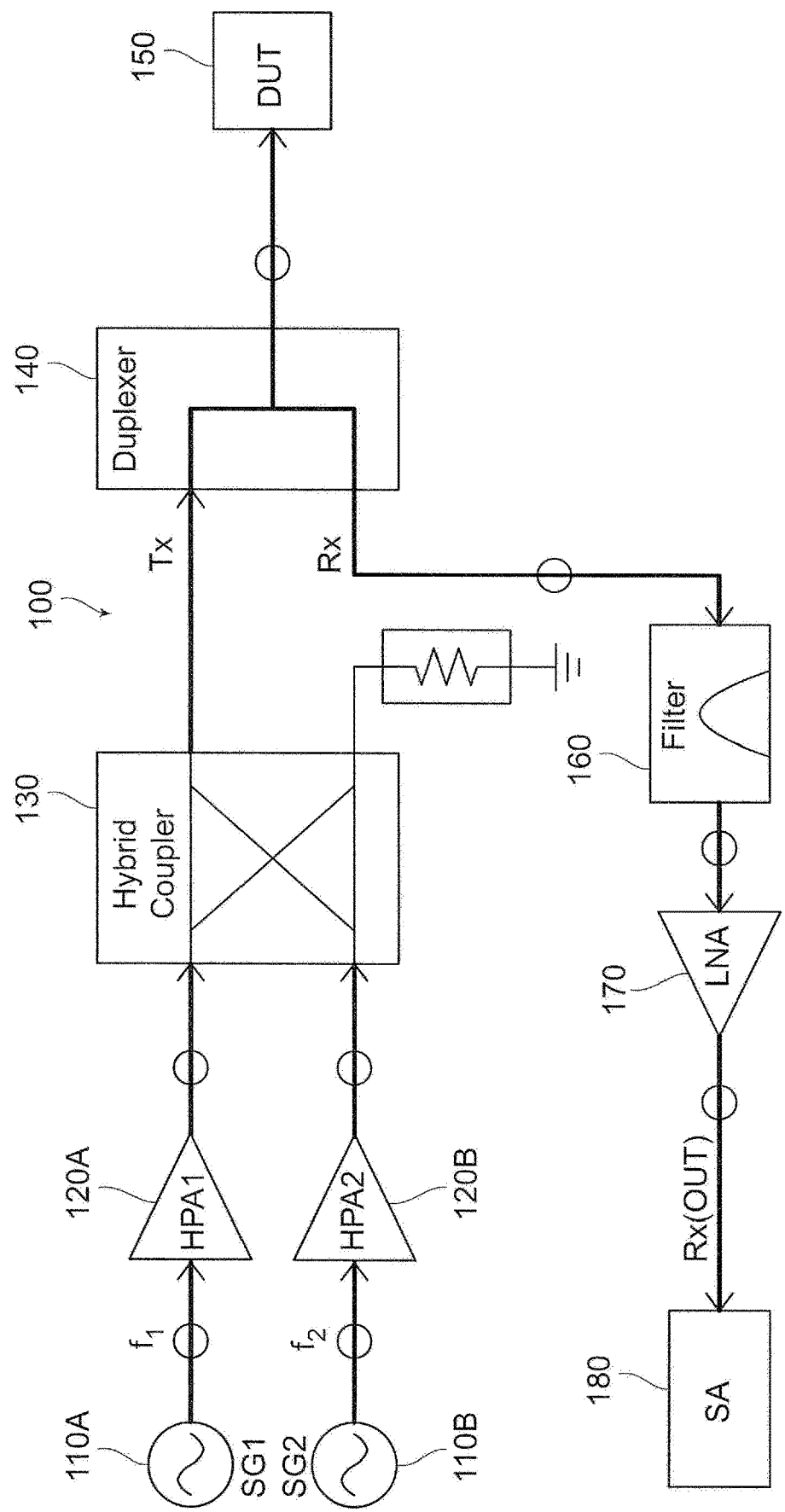
FIG. 2 is an explanatory diagram of a PIM evaluation system for evaluating PIM characteristics of an antenna structure.

FIG. 2 is an explanatory diagram of a PIM evaluation system 100 for evaluating PIM characteristics of the antenna structures 1, 2.

The PIM evaluation system 100 includes two signal generators (SGs) 110A, 110B, two high power amplifiers (HPAs) 120A, 120B, a hybrid coupler 130, a duplexer 140, a device under test (DUT) 150, a band pass filter 160, a low noise amplifier (LNA) 170, and a signal analyzer (SA) 180. The signal generator 110A may be referred to as the SG1, the signal generator 110B may be referred to as the SG2, the high power amplifier 120A may be referred to as the HPA1, and the high power amplifier 120B may be referred to as the HPA2.

The signal generator 110A (SG1) generates signals of a frequency $f_1$. The signal generator 110B (SG2) generates signals of a frequency $f_2$ different from the frequency $f_1$. An output terminal of the signal generator 110A (SG1) is connected to an input terminal of the high power amplifier 120A (HPA1). Thus, the high power amplifier 120A (HPA1) amplifies signals of the frequency $f_1$ and outputs the signals from its output terminal. An output terminal of the signal generator 110B (SG2) is connected to an input terminal of the high power amplifier 120B (HPA2). Thus, the high power amplifier 120B (HPA2) amplifies signals of the frequency $f_2$ and outputs the signals from its output terminal.

The hybrid coupler 130 includes two input terminals and an output terminal. The output terminal of the high power amplifier 120A (HPA1) is connected to one of the two input terminals of the hybrid coupler 130, and the output terminal of the high power amplifier 120B (HPA2) is connected to the other of the two input terminals of the hybrid coupler 130. That is, the hybrid coupler 130 combines the signals of the frequency $f_1$ amplified by the high power amplifier 120A (HPA1) and the signals of the frequency $f_2$ amplified by the high power amplifier 120B (HPA2) and outputs these signals from its output terminal.

The duplexer 140 includes an input terminal, an output terminal, and a terminal that is connected to the device under test (DUT) 150. The input terminal of the duplexer 140 is connected to the output terminal of the hybrid coupler 130. That is, the input terminal of the duplexer 140 receives input of the combined signals Tx of the amplified signals of the frequency $f_1$ and the amplified signals of the frequency $f_2$. The duplexer 140 transmits the signals Tx to the device under test (DUT) 150. The duplexer 140 outputs, from its output terminal, signals Rx returned from the device under test (DUT) 150 after separating the signals Rx from the signals Tx.

An input terminal of the band pass filter 160 is connected to the output terminal of the duplexer 140. That is, the band pass filter 160 selects signals of a desired frequency band from the signals Rx returned from the device under test (DUT) 150 and outputs the selected signals from its output terminal.

An input terminal of the low noise amplifier (LNA) 170 is connected to the output terminal of the band pass filter 160. That is, the low noise amplifier (LNA) 170 amplifies the signals of the frequency band selected by the band pass filter 160 and outputs the signals from its output terminal. Here, the signals output by the low noise amplifier (LNA) 170 are referred to as signals Rx (OUT).

An input terminal of the signal analyzer (SA) 180 is connected to the output terminal of the low noise amplifier (LNA) 170. The signal analyzer (SA) 180 quantifies the magnitude (power) of the input signals Rx (OUT).

The PIM will be described below.

When two or more frequencies (here, the frequencies $f_1$, $f_2$) are input to a component whose input-output characteristics are non-linear, signals of a frequency different from those frequencies are generated.

For example, when two signals of the frequencies $f_1$, $f_2$ enter the non-linear component, intermodulation (IM) wave with a frequency of $mf_1 \pm nf_2$ is generated besides harmonics with frequencies of $mf_1$ and $nf_2$ (where m and n are integers of more than one). For example, $f_2-f_1$ is a second order IM wave, $2f_1-f_2$ is a third order IM wave, and $3f_1-2f_2$ is a fifth order IM wave.

In general, the lower the order of the IM wave is, the greater the strength (amplitude and power) of the IM wave is. Thus, any occurrence of low-order IM wave in the received frequency band may inhibit reception of desired signals.

Note that the IM generated in passive components such as the antenna structures 1 and 2 is the PIM.

The PIM evaluation system 100 shown in FIG. 2 can evaluate the magnitude (power) of the IM wave generated by the antenna structures 1 and 2 each as the device under test (DUT) 150. This evaluation is made by causing the signal generator 110A (SG1) and the signal generator 110B (SG2) to respectively generate the signals of the frequencies $f_1$ and $f_2$ that are transmitted and received by the dual-frequency antenna 12a of the antenna element 12.

The PIM characteristics were evaluated for the following three cases, under the condition that power of both of the signals of the frequency $f_1$ generated by the signal generator 110A (SG1) and amplified by the high power amplifier 120A (HPA1) and the signals of the frequency $f_2$ generated by the signal generator 110B (SG2) and amplified by the high power amplifier 120B (HPA2) was 30 dBm (1 W).

(1) With the frequency $f_1$ at 925 MHz and the frequency $f_2$ at 960 MHz in the 900 MHz band, the power at 890 MHz, which is a third-order IM wave $f_{3M}$ ($=2f_1-f_2$), was measured.

(2) With the frequency $f_1$ at 1805 MHz and the frequency $f_2$ at 1730 MHz in the 1800 MHz band, the power at 1880 MHz, which is a third-order IM wave $f_{3M}$ ($=2f_1-f_2$), was measured.

(3) With the frequency $f_1$ at 2110 MHz and the frequency $f_2$ at 2170 MHz in the 2100 MHz band, the power at 2050 MHz, which is a third-order IM wave $f_{3M}$ ($=2f_1-f_2$), was measured.

Figure 3:
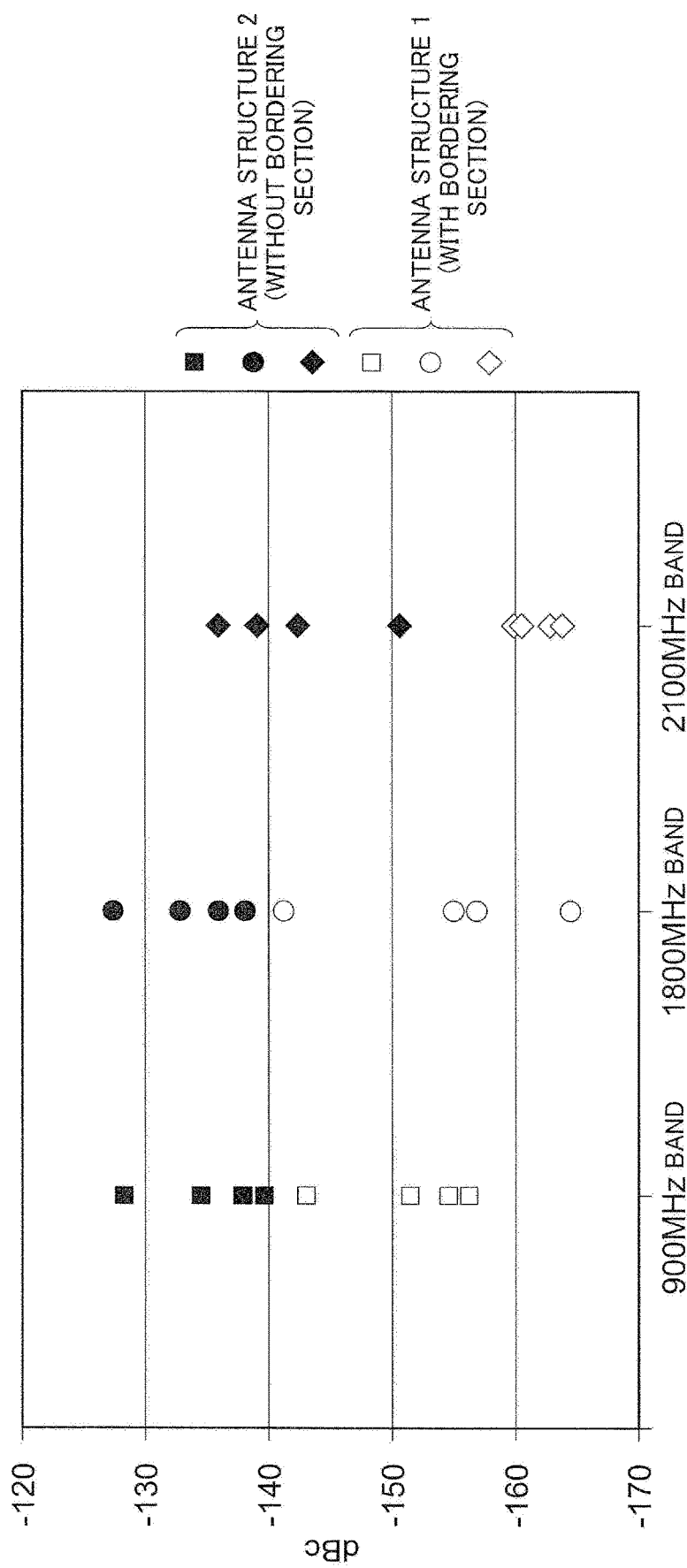
FIG. 3 shows evaluation results of the PIM characteristics.

FIG. 3 shows the results of evaluation of the PIM characteristics. In the figure, the vertical axis indicates the magnitude (power) of the IM wave as represented by dBc based on 30 dBm. The antenna structure 1 with the bordering section β is denoted as the "antenna structure 1 (with bordering section)" and the antenna structure 2 without the bordering section β is denoted as the "antenna structure 2 (without bordering section)".

In any of the 900 MHz band, the 1800 MHz band, and the 2100 MHz band, the antenna structure 1 with the bordering section β has a smaller magnitude (power) of the IM wave than the antenna structure 2 without the bordering section β.

The results of averaging five measurements of the IM wave showed that, in the 900 MHz band, the power of the IM wave of the antenna structure 2 without the section β was −104.5 dBm while that of the antenna structure 1 with the bordering section β was −115.6 dBm, showing improvement in the PIM characteristics by 11.1 dBm. In the 1800 MHz band, the power of the IM wave of the antenna structure 2 without the section β was −103.3 dBm while that of the antenna structure 1 with the bordering section β was −124.0 dBm, showing improvement in the PIM characteristics by 20.7 dBm. In the 2100 MHz band, the power of the IM wave of the antenna structure 2 without the section β was −112.0 dBm while that of the antenna structure 1 with the bordering section β was −131.5 dBm, showing improvement in the PIM characteristics by 19.5 dBm.

Due to the absence of the bordering section β, the antenna structure 2 have the branch-like protrusions along the edges of its surface section a processed into a mesh form (here, lattice form). Hence, the antenna structure 2 is susceptible to generation of micro discharge due to electric field concentration in the branch-like protrusions. This is estimated to be the cause of the larger magnitude (power) of the IM wave. This means that providing the bordering section β to eliminate the branch-like protrusions along the edges of the surface section α, as in the antenna structure 1, leads to reduced magnitude of the IM wave.

Micro discharge at the branch-like protrusions along the edges of the surface section α occurs more often in areas with large electric fields. Thus, instead of being provided entirely along the edges of the dual-frequency antenna 12*a* and the antenna GNDs 12*b*, the bordering section β may be provided partially such as in areas near the contact part 13 (the part denoted by γ in FIG. 1A), where the dual-frequency antenna 12*a* and the antenna GNDs 12*b* are close to each other. This can reduce occurrence of the IM wave. The bordering section β may be provided according to the magnitude (power) of the IM wave.

When the mesh-like surface section α has a lattice structure, the bordering section β may become conspicuous depending on where on the surface section α the bordering section β is provided.

Figure 4A:
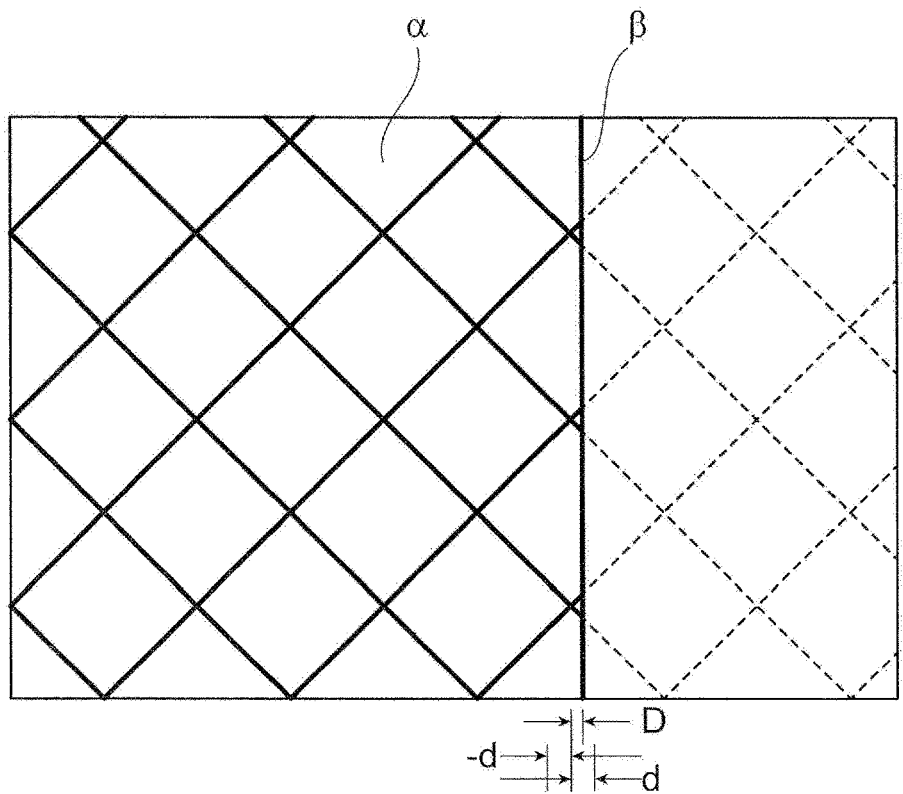
FIGS. 4A and 4B are explanatory diagrams of a positional relationship between a surface section having a lattice-like mesh pattern and a bordering section.
Figure 4B:
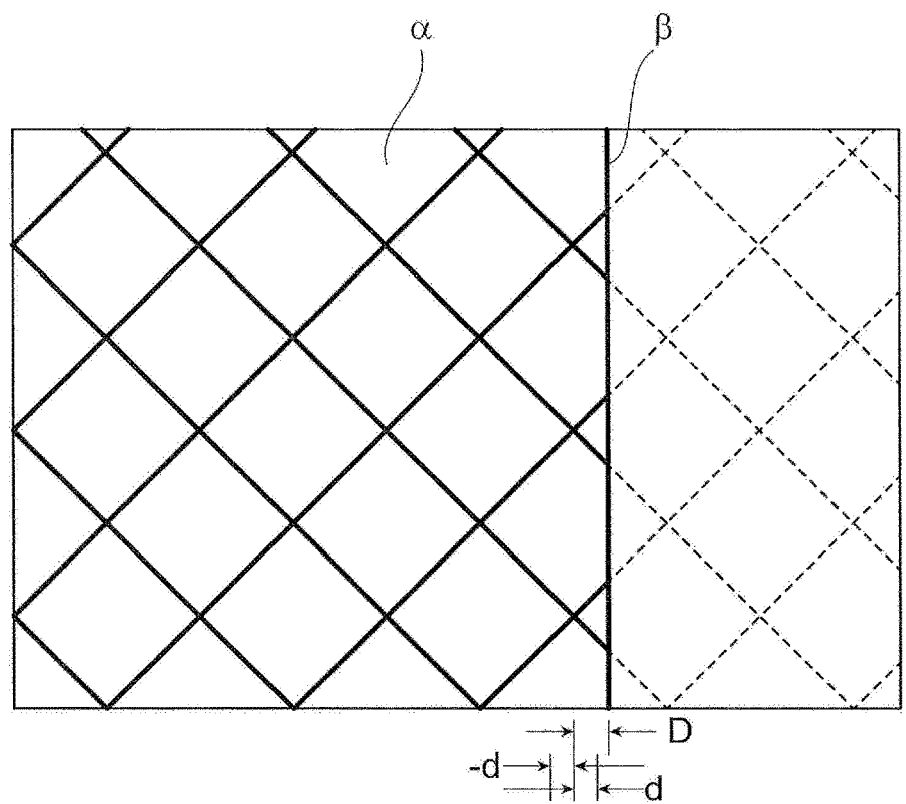

FIGS. 4A and 4B are explanatory diagrams of a positional relationship between the surface section α having a lattice-like mesh pattern and the bordering section β. FIG. 4A shows a positional relationship where there is a short distance D between a point of intersection on the lattice constituting the surface section α and the bordering section β ($|D|\le d$). FIG. 4B shows a positional relationship where there is a large distance D between a point of intersection on the lattice constituting the surface section α and the bordering section β ($|D|>d$).

When an absolute value of the distance D between a point of intersection on the lattice constituting the surface section α and the bordering section β is equal to or lower than a predetermined value d as shown in FIG. 4A ($|D|\le d$), such proximity between the point of intersection on the lattice and the bordering section β makes them visually merged, resulting in the bordering section β looking emphasized. Thus, it is preferable that the bordering section β be provided relative to the point of intersection constituting the surface section α such that the absolute value of the distance D between the point of intersection on the lattice and the bordering section β exceeds the predetermined value d ($|D|>d$), as shown in FIG. 4B.

The value d may be determined by factors including, but not limited to, an area in the lattice (an area of each opening in the lattice), width of the lattice, and distance from viewers.

In the foregoing description, the mesh pattern of the surface section α has been described as being a lattice pattern; however, the mesh pattern of the surface section α may be other than a lattice pattern.

Figure 5A:
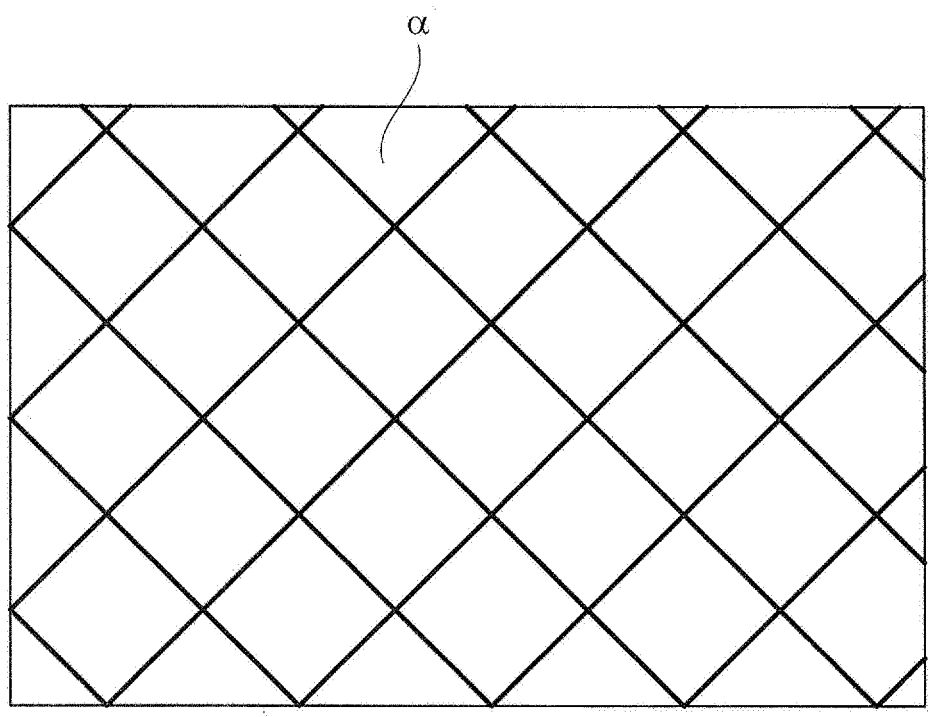
FIGS. 5A and 5B are explanatory diagrams of mesh patterns of the surface section.
Figure 5B:
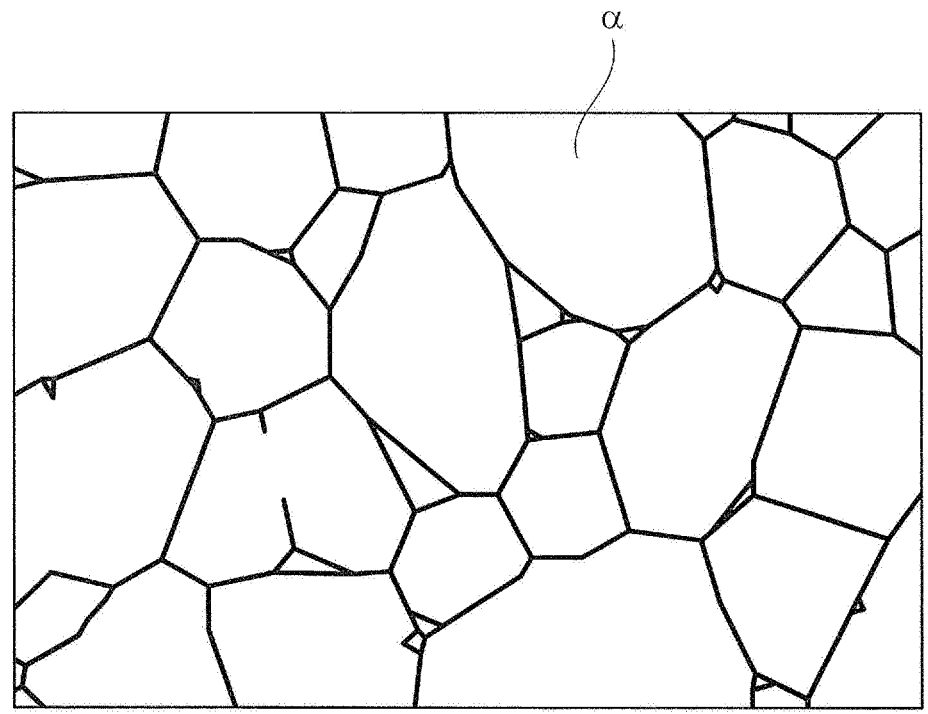

FIGS. 5A and 5B are explanatory diagrams of mesh patterns of the surface section α. FIG. 5A shows the surface section a having a lattice-like mesh pattern. FIG. 5B shows the surface section α having a random mesh pattern.

When the surface section α has a lattice-like mesh pattern as shown in FIG. 5A, such a regular pattern may cause moire, which may make the antenna element 12 conspicuous. On the other hand, the random mesh pattern of the surface section α as shown in FIG. 5B is less prone to occurrence of moire, which makes the antenna element 12 less conspicuous. The mesh pattern of the surface section α may be any other mesh pattern.

The mesh pattern as referred to herein includes lattice-like mesh, random mesh and other mesh patterns. That is, the mesh-like transparent conductor refers to one that is obtained by making mesh-like openings (holes) in a conductor film originally with low visible light transmittance and thereby imparting high visible light transmittance to the film as a whole (or making the film transmit visible light). There is no particular limitation to the pattern of the mesh as long as the mesh imparts high visible light transmittance to the conductor film as a whole (or makes the conductor film transmit visible light). The mesh-like transparent conductor may be one with sheet resistance of below 20 Ω/sq. and light transmittance of 70% or more.

Second Embodiment

The second embodiment describes a radio wave shielding structure 4 as an example of the structure including the mesh-like transparent conductor. The radio wave shielding structure 4 reflects radio waves to thereby blocks them from propagating through the radio wave shielding structure 4. The radio wave shielding structure 4 may be configured to transmit radio waves of a specific frequency band. Here, besides the one that blocks propagation of radio waves, the radio wave shielding structure 4 includes a frequency selective sheet (FSS) that transmits radio waves of a specific frequency band while blocking radio waves of other frequency bands.

In some cases, the radio wave shielding structure 4 is required to be transparent to visible light, such as when used as a partition inside a room. For example, the radio wave shielding structure 4 with transparency to visible light is required in a conference room that needs to be shielded from radio waves coming to the room but whose interior needs to be seen through the radio wave shielding structure 4.

Figure 6:
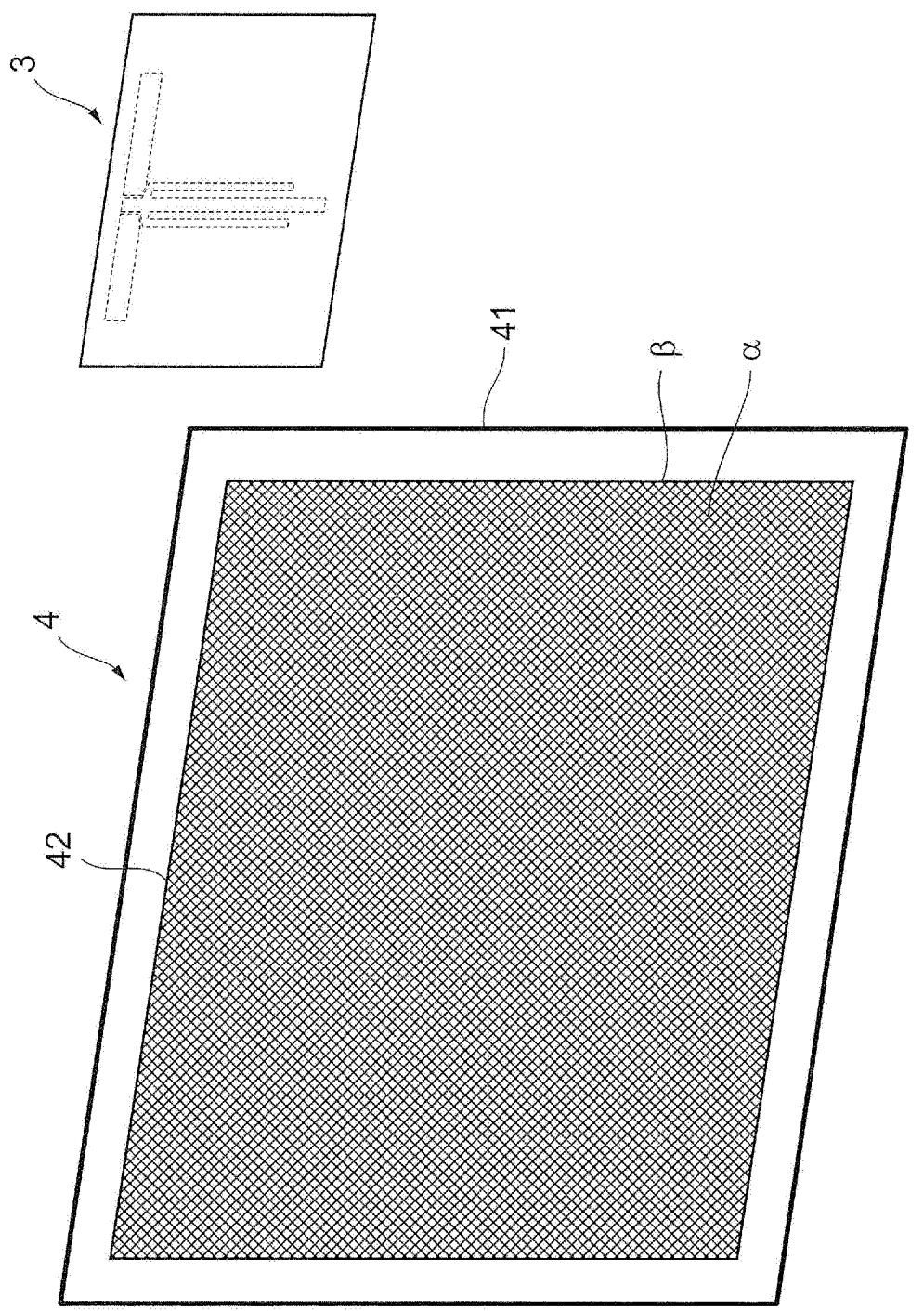
FIG. 6 is a plan view explaining a radio wave shielding structure.

FIG. 6 is a plan view explaining the radio wave shielding structure 4. Besides the radio wave shielding structure 4, FIG. 6 also shows an antenna structure 3 transmitting and receiving radio waves of multiple frequencies. The radio wave shielding structure 4 blocks radio waves from the antenna structure 3 transmitting and receiving radio waves so that the radio waves do not travel in a specific direction or do not reach a specific place. Accordingly, the radio wave shielding structure 4 and the antenna structure 3 are located close to each other.

The radio wave shielding structure 4 is configured as a flexible printed circuit (FPC) board. The radio wave shielding structure 4 includes a film 41 with high visible light transmittance, and a radio wave shielding part 42 placed on the film 41 (placed on the surface of the film 41). The radio wave shielding part 42 is made of a transparent conductor processed into a mesh form (mesh-like transparent conductor). By way of example, the mesh pattern of the transparent conductor is lattice-shaped; however, the mesh pattern may be any other shape such as a random mesh pattern shown in FIG. 5B. Similarly to the dual-frequency antenna 12*a* and the antenna GNDs 12*b* of the antenna structure 1 of the first embodiment, the radio wave shielding part 42 includes the lattice-shaped surface section α and the bordering section β bordering edges of the surface section α.

The film 41 may be similar to the film 11 as explained in the first embodiment. The conductive material constituting the mesh-like transparent conductor used for the radio wave shielding part 42 may be similar to that constituting the mesh-like transparent conductor used for the antenna element 12 as explained in the first embodiment. The film 41 is an example of the substrate.

Constituting the radio wave shielding part 42 by the mesh-like transparent conductor allows the radio wave shielding structure 4 to transmit visible light (become transparent to visible light). If, however, radio waves of multiple frequencies transmitted from the antenna structure 3 reach the radio wave shielding structure 4, the IM wave may be generated from the radio wave shielding structure 4.

In view of this, the radio wave shielding structure 4 of the second embodiment includes the bordering section β in the radio wave shielding part 42. This may prevent formation of branch-like protrusions along the edges of the surface section α. This reduces deterioration in the PIM characteristics, similarly to the antenna structure 1 of the first embodiment.

Since the IM wave is more likely to occur with increase in the radio wave intensity, the bordering section β may be provided on a part of the edges of the radio wave shielding part 42 that is closer to the antenna structure 3.

When the radio wave shielding structure 4 is configured as the frequency selective sheet (FSS), the size of the mesh in the surface section α of the radio wave shielding part 42 may be set according to the frequency band that the radio wave shielding structure 4 is required to transmit.

Third Embodiment

The third embodiment describes a touch panel 6 as an example of the structure including the mesh-like transparent conductor. In response to being touched by a finger or a pen, the touch panel 6 outputs information on the touched position. When laid on a display device such as a liquid crystal display, the touch panel 6 is required to be transparent to ensure visibility of the display device.

Figure 7:
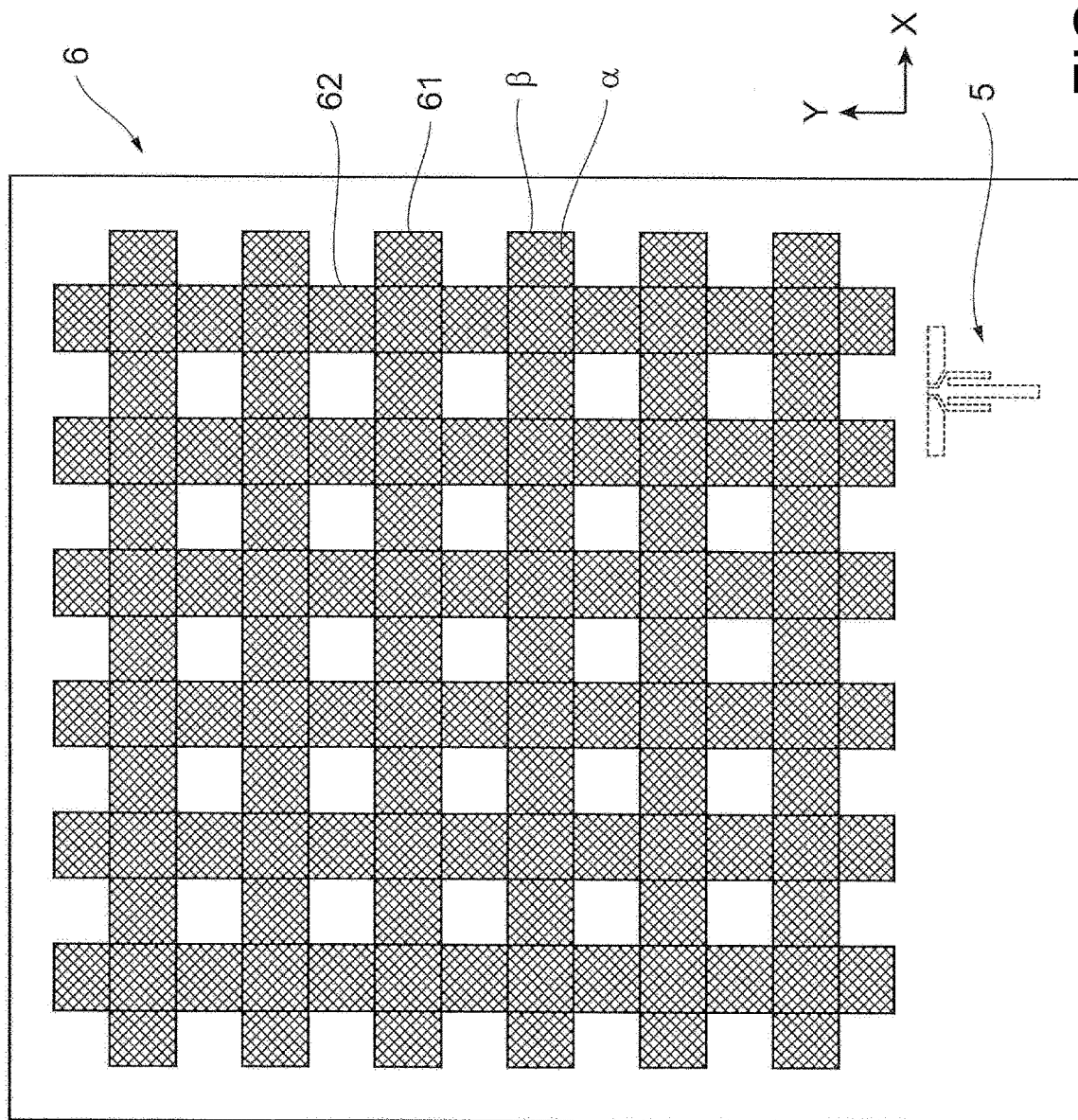
FIG. 7 is a plan view explaining a touch panel.

FIG. 7 is a plan view explaining the touch panel 6. Besides the touch panel 6, FIG. 7 also shows an antenna structure 5 transmitting and receiving radio waves of multiple frequencies. In a mobile terminal used for mobile communication, the touch panel 6 and the antenna structure 5 may be arranged close to each other.

The touch panel 6 includes X-direction electrodes 61 formed on a glass or film (surface of the film) having high visible light transmittance and Y-direction electrodes 62 formed on another glass or film (surface of the film) also having high visible light transmittance. The X-direction electrodes 61 and the Y-direction electrodes 62 are stacked with an insulation layer in-between so as to face each other. Here, the X-direction electrodes 61 and the Y-direction electrodes 62 are perpendicular to each other; however, the X-direction electrodes 61 and the Y-direction electrodes 62 are only required to cross each other.

Both of the X-direction electrodes 61 and the Y-direction electrodes 62 are composed of a transparent conductor processed into a mesh form (mesh-like transparent conductor). By way of example, the mesh pattern of the transparent conductor shown in FIG. 7 is lattice-shaped; however, the mesh pattern may be any other shape such as a random mesh pattern shown in FIG. 5B. Similarly to the dual-frequency antenna 12a and the antenna GNDs 12b of the antenna structure 1 of the first embodiment, both of the X-direction electrodes 61 and the Y-direction electrodes 62 include the lattice-shaped surface section α and the bordering section β laid along edges of the surface section α.

The above films may be similar to the film 11 as explained in the first embodiment. The conductive material constituting the mesh-like transparent conductor used for the X-direction electrodes 61 and the Y-direction electrodes 62 may be similar to that constituting the mesh-like transparent conductor used for the antenna element 12 as explained in the first embodiment.

The glass or film having high visible light transmittance is an example of the first substrate, another glass or film having high visible light transmittance is an example of the second substrate. The X-direction electrodes 61 are an example of the first electrode, and the Y-direction electrodes 62 are an example of the second electrode.

The touch panel 6 may be activated using any known technique. Accordingly, description regarding activation of the touch panel 6 is omitted here.

Using the mesh-like transparent conductor for the touch panel 6 makes the touch panel 6 highly transparent to visible light (makes the touch panel 6 transmit visible light). If, however, radio waves of multiple frequencies transmitted from the antenna structure 5 reach the touch panel 6, the IM wave may be generated from the touch panel 6.

In view of this, the touch panel 6 of the third embodiment includes the bordering section β in the X-direction electrodes 61 and the Y-direction electrodes 62. This may prevent formation of branch-like protrusions along the edges of the surface section α. This reduces deterioration in the PIM characteristics, similarly to the antenna structure 1 of the first embodiment.

Since the IM wave is more likely to occur with increase in the radio wave intensity, the bordering section β may be provided only on a part of edges of the X-direction electrodes 61 and the Y-direction electrodes 62 that is closer to the antenna structure 5.

In the foregoing description, the antenna structure 1, the radio wave shielding structure 4, and the touch panel 6 have been taken as an example of the structure including the mesh-like transparent conductor. However, the mesh-like transparent conductor is not limited to these; the structure including the mesh-like transparent conductor may be any electronic device or electronic component that is required to have high visible light transmittance (required to transmit visible light) and used in applications where the device or component receives signals or radio waves of multiple frequencies. The structure including the mesh-like transparent conductor includes these electronic devices and components.

The first to the third embodiments have been described above. However, other various modifications may be made within the scope of the present invention.

The invention claimed is:

1. A structure including a mesh-like transparent conductor, the structure comprising:
   a substrate composed of an electrical insulating material transmitting visible light;
   a surface section provided on one face of the substrate, the surface section being made of a conductive material formed in a mesh form and having a thickness that hardly transmits visible light, the surface section having a predetermined shape; and
   a bordering section provided on the one face of the substrate, the bordering section being made of a conductive material and configured to border, along at least a part of edges of the surface section, the edges of the surface section by connecting tips of protrusions to each other, the tips of protrusions extending along the one face of the substrate on the edges of the surface section.

2. The structure including the mesh-like transparent conductor according to claim 1, wherein the bordering section is provided near an area with a highest electric field.

3. The structure including the mesh-like transparent conductor according to claim 1, wherein the bordering section is provided so as to surround the edges of the surface section.

4. An antenna structure comprising:
   a substrate made of an electrical insulating material transmitting visible light; and
   an antenna element provided on one face of the substrate, the antenna element being configured to transmit and receive radio waves, wherein the antenna element includes:
- a surface section made of a conductive material formed in a mesh form and having a thickness that hardly transmits visible light, the surface section having a predetermined shape; and
- a bordering section made of a conductive material and configured to border, along at least a part of edges of the surface section, the edges of the surface section by connecting tips of protrusions to each other, the tips of protrusions extending along the one face of the substrate on the edges of the surface section.

5. The antenna structure according to claim 4, wherein the antenna element includes a radiation electrode and a ground electrode, and
the bordering section is provided at portions of the radiation electrode and the ground electrode where the radiation electrode and the ground electrode are near each other.

6. A radio wave shielding structure comprising:
an electrical insulating substrate transmitting visible light; and
a radio wave shielding part provided on one face of the substrate and configured to prevent transmission of at least radio waves of a predetermined frequency band, wherein
the radio wave shielding part includes:
- a surface section made of a conductive material formed in a mesh form and having a thickness that hardly transmits visible light; and
- a bordering section made of a conductive material and configured to border, along at least a part of edges of the surface section, the edges of the surface section by connecting tips of protrusions to each other, the tips of protrusions extending along the one face of the substrate on the edges of the surface section.

7. The radio wave shielding structure according to claim 6, wherein the bordering section is provided at a portion of the radio wave shielding part that is near an external antenna structure configured to transmit and receive radio waves of multiple frequencies.

8. A touch panel comprising:
a first electrical insulating substrate transmitting visible light;
a first electrode provided on one face of the first substrate and extending in a predetermined direction;
a second electrical insulating substrate transmitting visible light; and
a second electrode provided on one face of the second substrate and extending in a direction crossing the predetermined direction,
wherein the first electrode and the second electrode are arranged to face each other between the first substrate and the second substrate,
wherein each of the first electrode and the second electrode includes:
- a surface section made of a conductive material formed in a mesh form and having a thickness that hardly transmits visible light; and
- a bordering section made of a conductive material and configured to border, along at least a part of edges of the surface section, the edges of the surface section by connecting tips of protrusions to each other, the tips of protrusions extending along the one face of the substrate on the edges of the surface section.

9. The touch panel according to claim 8, wherein the bordering section is provided at portions of the first electrode and the second electrode that are near an external antenna structure configured to transmit and receive radio waves of multiple frequencies.

* * * * *